(12) United States Patent
Howland, Jr.

(10) Patent No.: US 7,250,313 B2
(45) Date of Patent: Jul. 31, 2007

(54) METHOD OF DETECTING UN-ANNEALED ION IMPLANTS

(75) Inventor: William H. Howland, Jr., Wexford, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 296 days.

(21) Appl. No.: 10/954,528

(22) Filed: Sep. 30, 2004

(65) Prior Publication Data

US 2006/0068514 A1  Mar. 30, 2006

(51) Int. Cl.
*H01L 21/66* (2006.01)
*F01R 31/26* (2006.01)

(52) U.S. Cl. .................. 438/17; 438/14; 257/E21.525; 257/E21.531

(58) Field of Classification Search ............ 438/14, 438/17; 257/E21.525, E21.531
See application file for complete search history.

(56) References Cited

U.S. PATENT DOCUMENTS

| | | | |
|---|---|---|---|
| 3,794,912 A * | 2/1974 | Severin et al. ............. 324/719 |
| 4,101,830 A * | 7/1978 | Greig ....................... 324/754 |
| 4,764,026 A * | 8/1988 | Powell et al. .............. 374/178 |
| 5,786,231 A * | 7/1998 | Warren et al. ............... 438/17 |
| 6,235,617 B1 * | 5/2001 | Kawai ....................... 438/520 |
| 6,417,515 B1 * | 7/2002 | Barrett et al. .......... 250/492.21 |
| 6,927,151 B2 * | 8/2005 | Kwak ........................ 438/527 |
| 7,033,873 B1 * | 4/2006 | Lall et al. .................... 438/174 |
| 2002/0027660 A1 * | 3/2002 | Borden et al. .............. 356/502 |
| 2002/0180474 A1 * | 12/2002 | Howland et al. ............ 324/765 |
| 2003/0235928 A1 * | 12/2003 | Lu et al. ........................ 438/5 |
| 2005/0181524 A1 * | 8/2005 | Borden ........................ 438/14 |
| 2006/0019415 A1 * | 1/2006 | Jaiswal et al. ............... 438/14 |

OTHER PUBLICATIONS

Hulenyi, L. and Kinder, R. "Some Possibilities for Determining the Depth of the p-n Junction and Profiles of Semiconductor Layers." Advanced Semiconductor Devices and Microsystems, 2002. The Fourth International Conference On. IEEE Oct. 14-16, 2002 pp. 111-114.*

* cited by examiner

*Primary Examiner*—B. William Baumeister
*Assistant Examiner*—Matthew W. Such
(74) *Attorney, Agent, or Firm*—The Webb Law Firm

(57) ABSTRACT

A current-voltage response of at least one site of a semiconductor wafer where ions have been implanted in the semiconducting material of the semiconductor wafer is measured prior to annealing the semiconductor wafer. From the measured response, a determination is made whether the ion implantation is within acceptable tolerance(s).

21 Claims, 4 Drawing Sheets

METHOD OF DETECTING UN-ANNEALED ION IMPLANTS

BACKGROUND OF THE INVENTION

1. Field of the Invention

The present invention relates to semiconductor wafers and, more particularly, to determining the efficacy of ion implantation of a semiconductor wafer.

2. Description of Related Art

Presently, in semiconductor wafers, electrically based ion implantation detection measurements detect changes in ion implantation concentration and energy, but require as a prerequisite an annealing step to activate the implant. This can be problematic since typically it is desired to determine whether ion implantation of the semiconductor wafers is within acceptable tolerance(s) before the time-consuming and costly annealing step and any other processing steps between ion implantation and annealing.

It would, therefore, be desirable to overcome the above problems and others by providing a method for testing the efficacy of ion implantation of a semiconductor wafer before the annealing step. Other problems that the present invention overcomes will become apparent to those of ordinary skill in the art upon reading and understanding the following detailed description.

SUMMARY OF THE INVENTION

The invention is a method of determining the efficacy of ion implantation in a semiconductor wafer. The method includes providing a semiconductor wafer having a substrate of semiconducting material and a screen dielectric layer overlaying the substrate of semiconducting material and defining on a surface of the screen dielectric layer opposite the semiconducting material a photoresist that includes at least one aperture therethrough where the screen dielectric layer is exposed. The surface of the semiconductor wafer having the photoresist thereon is ion implanted with suitable ions whereupon at least a portion of the ions impacting the screen dielectric via the aperture in the photoresist come to rest in the semiconducting material adjacent the aperture. The photoresist is removed from the semiconductor wafer and, prior to annealing the semiconductor wafer, at least one electrical contact is formed with the surface of either the screen dielectric layer or the substrate of the semiconductor wafer in alignment with or adjacent the semiconducting material containing the implanted ions. An electrical response of the semiconducting material containing the implanted ions is measured via the electrical contact in response to the application of a suitable electrical stimulus. From the measured electrical response a determination is made whether the ion implantation is within acceptable tolerance(s).

Each electrical contact can be an electrically conductive probe. The portion of the probe that touches the surface desirably elastically deforms within its elastic limits but does not damage the surface. Alternatively, the electrical contact can be a mercury contact.

The implanted ions can either be p-type ions or n-type ions.

The forming at least one electrical contact can include forming another electrical contact with the semiconducting material or forming a pair of electrical contacts with the surface, with said pair of electrical contacts spaced above or adjacent where the semiconducting material contains the ions.

Measuring the electrical response can include changing a voltage applied to the electrical contact from a first value toward a second value and measuring a current that flows in the electrical contact while the applied voltage changes from the first value toward the second value.

The determination whether the ion implantation is within acceptable tolerance(s) can include (1) determining whether a slope of the measured electrical response is greater than, less than, equal to, or within a desired range of a slope of an exemplary electrical response, or (2) for a specific voltage applied to the electrical contact, determining whether a value of a measured current is greater than, less than, equal to, or within a desired range of an exemplary current value.

The invention is also a method of determining the efficacy of ion implantation in a semiconductor wafer that includes providing a semiconductor wafer having at least one site where ions have been implanted in the semiconducting material of the semiconductor wafer and, prior to annealing the thus provided semiconductor wafer, measuring a current-voltage response of the one site. Based on the measured current-voltage response, a determination can be made whether the ion implantation is within acceptable tolerance(s).

The measurement of the current-voltage response is desirably taken (1) between the semiconducting material of the semiconductor wafer and either a top surface of the semiconducting material or a surface of a screen dielectric overlaying the top surface of the semiconducting material or (2) between two positions on either a top surface of the semiconducting material or a surface of a screen dielectric overlaying the top surface of the semiconducting material The method can further include causing a first contact to touch either the top surface of the semiconducting material or the exposed surface of the screen dielectric above or adjacent the one site, causing a second contact to touch the top surface, or a side or a back surface of the semiconducting material and measuring the current-voltage response between the first and second contacts.

The first contact can be a mercury contact or an electrically conductive probe. The second contact can be a conductive surface, a mercury contact or an electrically conductive probe.

The determination whether the ion implantation is within acceptable tolerance(s) can include determining whether the measured current-voltage response is within a desired range of an exemplary current-voltage response. If so, the semiconductor wafer can be designated as being ion implanted within the acceptable tolerance(s). If not, the semiconductor wafer can be designated as being ion implanted outside the acceptable tolerance(s).

Lastly, the invention is a method of determining the efficacy of ion implantation in a semiconductor wafer that includes measuring via at least one point on a top surface of a semiconductor wafer a post ion implantation current-voltage response of the semiconducting material of the semiconductor wafer prior to annealing the semiconductor wafer to activate the implanted ions and determining from the thus measured current-voltage response whether the ion implantation is within acceptable tolerance(s).

The acceptable tolerance(s) desirably is an indication of the number of ions residing in the semiconducting material adjacent the one point.

The determination whether the ion implantation is within acceptable tolerance(s) can include determining whether a slope of the measured current-voltage response is less than, equal to, greater or within a predetermined range of a slope of a predetermined current-voltage response. Also or alternatively, the determination whether the ion implantation is within acceptable tolerance(s) can include determining for a predetermined applied voltage whether a value of the measured current is less than, equal to, greater than or within a predetermined range of a predetermined current value.

The method can further included causing a first contact to touch the top surface of the semiconductor wafer at the one point and causing a second contact to touch one of the top surface of the semiconductor wafer at another point on the top surface of the semiconductor wafer, a side of the semiconductor wafer or the bottom surface of the semiconductor wafer. The measurement of the current-voltage response can include applying a swept or stepped voltage between the first and second contacts and measuring the response of the semiconductor wafer to the swept or stepped voltage.

DETAILED DESCRIPTION OF THE INVENTION

The present invention will be described with reference to the accompanying figures where like reference numbers correspond to like elements.

Figure 1:
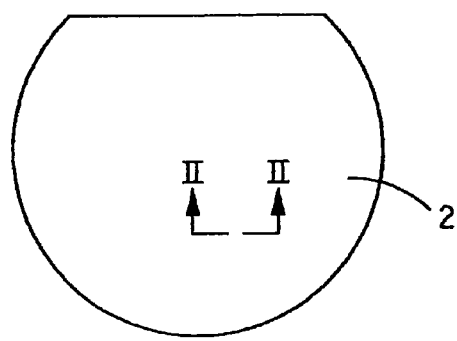
FIG. 1 is a top plan view of a semiconductor wafer.
Figure 2:
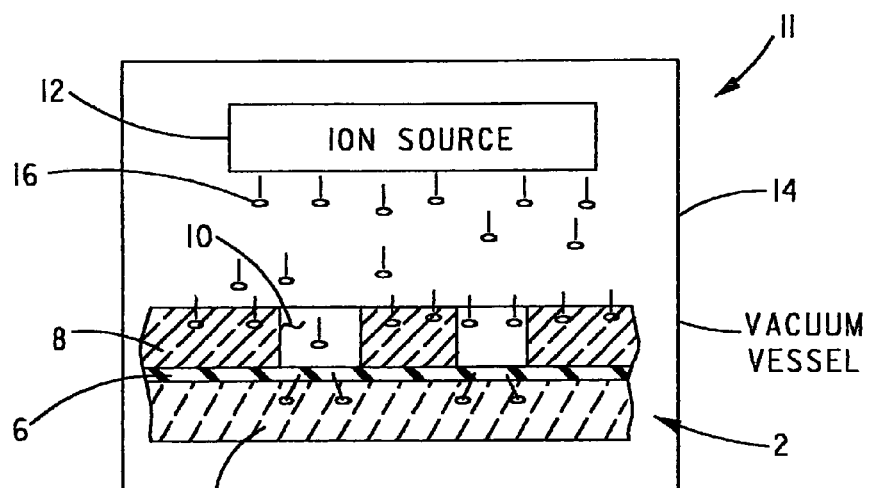
FIG. 2 is a cross-sectional view of the semiconductor wafer taken along lines II-II of FIG. 1 received in an ion implanter.

With reference to FIGS. 1 and 2, one of the processing steps for forming electronic elements on a semiconductor wafer 2 is ion implantation. In preparation for implanting ions in a substrate 4 of semiconducting material of semiconductor wafer 2, a screen dielectric layer 6, such as silicon dioxide, is grown or deposited on a top surface of substrate 4. Thereafter, a photoresist 8 is deposited on the surface of the screen dielectric layer 6 opposite substrate 4. Utilizing photolithographic processing techniques well known in the art, photoresist 8 is cured, patterned and etched in a manner whereupon photoresist 8 defines one or more apertures 10 therethrough where the surface of screen dielectric 6 opposite substrate 4 is exposed.

Next, semiconductor wafer 2 comprising substrate 4, screen dielectric layer 6 and patterned, cured and etched photoresist 8 is positioned inside an ion implanter 11. Ion implanter 11 includes an ion source 12 positioned inside of a vacuum vessel 14. When positioned inside ion implanter 11, semiconductor wafer 2 is positioned in vacuum vessel 14 with the surface thereof having photoresist 8 thereon positioned to receive ions 16 generated by ion source 12. Ions 16 can either be p-type ions or n-type ions depending on, among other things, whether substrate 4 is formed from n-type or p-type semiconducting material, respectively, and the type of junction(s) desired to be formed.

During ion implantation, ion source 12 generates ions 16 which are accelerated toward semiconductor wafer 2 and impact the surfaces of photoresist 8 and screen dielectric layer 6 that are exposed to ion source 12. In practice, the thickness of photoresist 8 is such that ions 16 impacting the surface thereof are captured in photoresist 8 for subsequent removal when photoresist 8 is removed from screen dielectric layer 6. In contrast, the thickness of screen dielectric layer 6 is such that at least some of ions impacting the material forming screen dielectric layer 6 are deflected thereby and come to rest in substrate 4 adjacent the boundary with screen dielectric layer 6. Suitable thicknesses of screen dielectric layer 6 and photoresist 8 can readily be determined by those of ordinary skill in the art. Accordingly, these thicknesses will not be described herein for simplicity of description.

Figure 3:
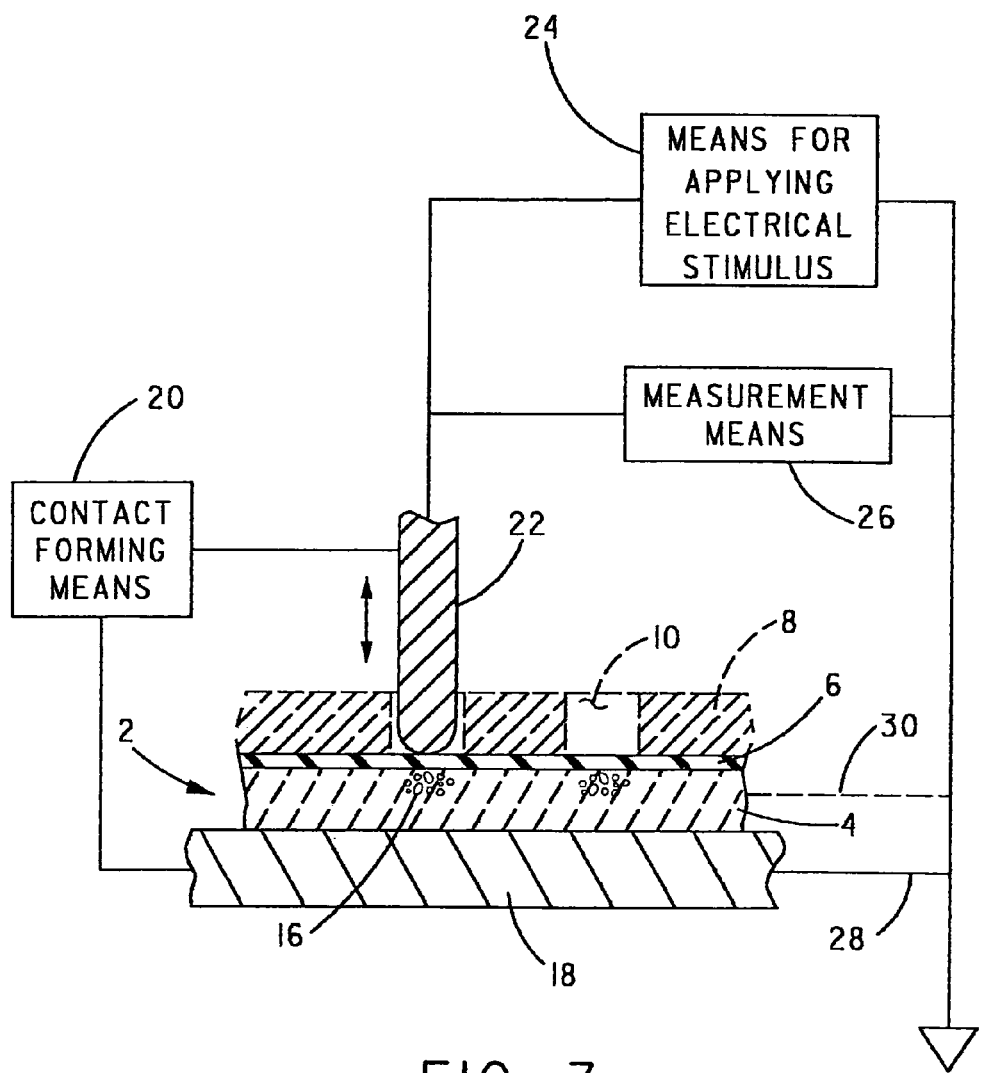
FIGS. 3 and 4 are combined cross-sectional views and block diagrams of two test system embodiments for testing the ion implanted portion of the semiconductor wafer shown in FIG. 2.
Figure 4:
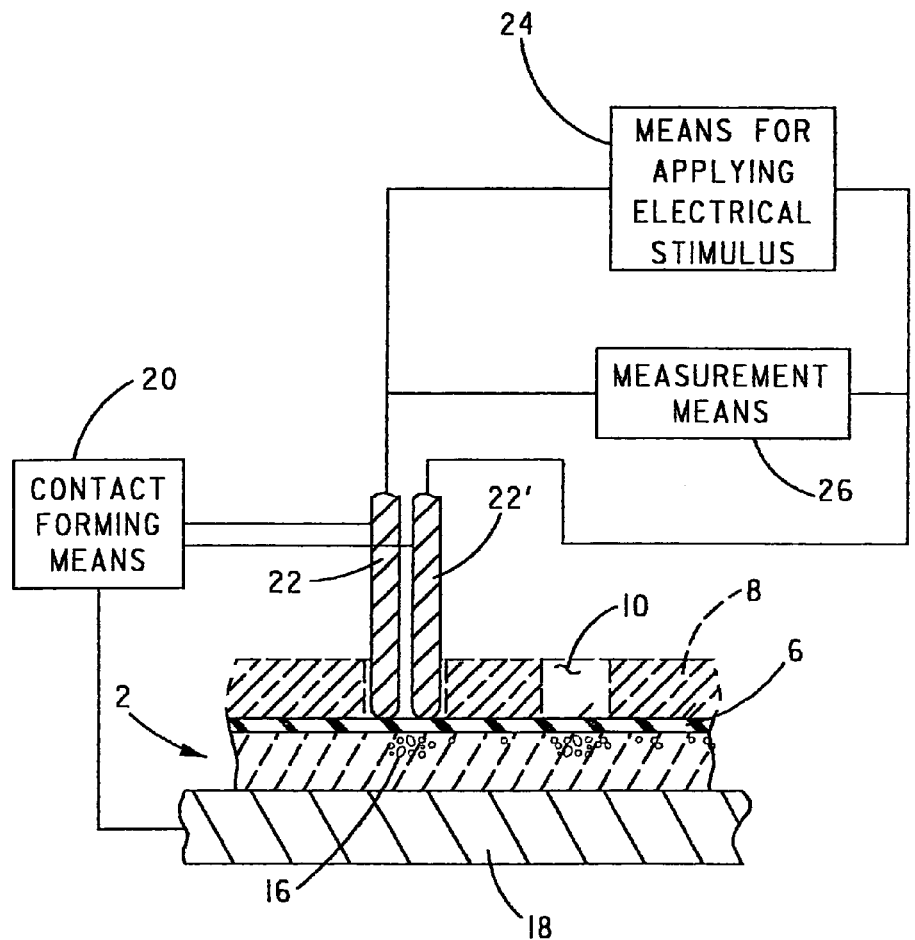

With reference to FIGS. 3 and 4, and with continuing reference to FIGS. 1 and 2, after ion implantation, semiconductor wafer 2 is removed from vacuum vessel 14. Thereafter, photoresist 8 is removed from screen dielectric layer 6 in a manner known in the art. In FIGS. 3 and 4, photoresist 8 is shown in phantom to facilitate a description of the invention. However, it is to be understood that photoresist 8 is not present on screen dielectric layer 6 in FIGS. 3 and 4.

With specific reference to FIG. 3, in order to determine whether a desired number of ions has been implanted in at least one site of substrate 4 in alignment with an aperture 10 of photoresist 8, the side of substrate 4 opposite screen dielectric layer 6 is received on a support means 18, such as a vacuum chuck. A contact forming means 20 is provided for causing a contact 22 to touch an exposed surface of screen dielectric layer 6 above the site where ions 16 have been implanted in substrate 4. A non-limiting example of a suitable site where contact 22 touches an exposed surface of screen dielectric 6 includes a non-functional area of substrate 4, such as a scribe line or a test structure. In the embodiment shown in FIG. 3, contact 22 is in the form of an elastic-conductive probe, desirably an elastic-metal probe like the one disclosed in U.S. Pat. No. 6,492,827 to Mazur et al. which is incorporated herein by reference. Alternatively, contact 22 can be a mercury (Hg) probe, the use of which is well known to those of ordinary skill in the art. The disclosure of contact 22 being an elastic-conductive probe or a Hg probe, however, is not to be construed as limiting the invention.

A means for applying electrical stimulus 24 and a measurement means 26 are electrically connected to contact 22 and to substrate 4, either via support means 18, as shown by solid line 28, or directly, as shown by dashed line 30. Contact 22 defines a first contact while the connection of means for applying electrical stimulus 24 and measurement means 26 to substrate 4, either directly or via support means 18, defines a second contact.

With specific reference to FIG. 4, alternatively, contact forming means 20 can cause a pair of contacts 22 and 22' to touch an exposed surface of screen dielectric 6 above a site where ions 16 have been implanted in substrate 4. Desirably, contacts 22 and 22' in FIG. 4 can be spaced on or adjacent opposite sides above the site where ions 16 are implanted in substrate 4. Each of contacts 22 and 22' can be in the form of an elastic-conductive probe of the type disclosed in the Mazur et al. patent discussed above or a mercury (Hg) probe of the type well known to those of ordinary skill in the art. The disclosure of each contacts 22 and 22' being an elastic-conductive probe or a Hg probe, however, is not to be construed as limiting the invention. Means for applying electrical stimulus 24 and measurement means 26 are electrically connected to contacts 22 and 22' as shown in FIG. 4. In this embodiment, contact 22 defines a first contact while contact 22' defines a second contact.

At a suitable time when support means 18 is supporting the side of substrate 4 opposite screen dielectric layer 6 by means of a vacuum (not shown) and either contact 22 is touching an exposed portion of the surface of screen dielectric layer 6 above the site where ions 16 have been implanted or spaced contacts 22 and 22' are touching exposed portions of the surface of screen dielectric 6 above or adjacent the site where ions 16 have been implanted, means for applying electrical stimulus 24 applies a voltage between contact 22 and substrate 4 or contact 22', and measurement means 26 measures the current that flows through contact 22 in response to the applied voltage. In one embodiment, the applied voltage is a DC voltage and the measured current is a DC current. In another embodiment, the applied voltage is an AC voltage and the measured current is an AC current. In yet another embodiment, the applied voltage is an AC voltage superimposed on a DC voltage and the measured current is an AC current and/or a DC current. However, these embodiments are not to be construed as limiting the invention.

Figure 5:
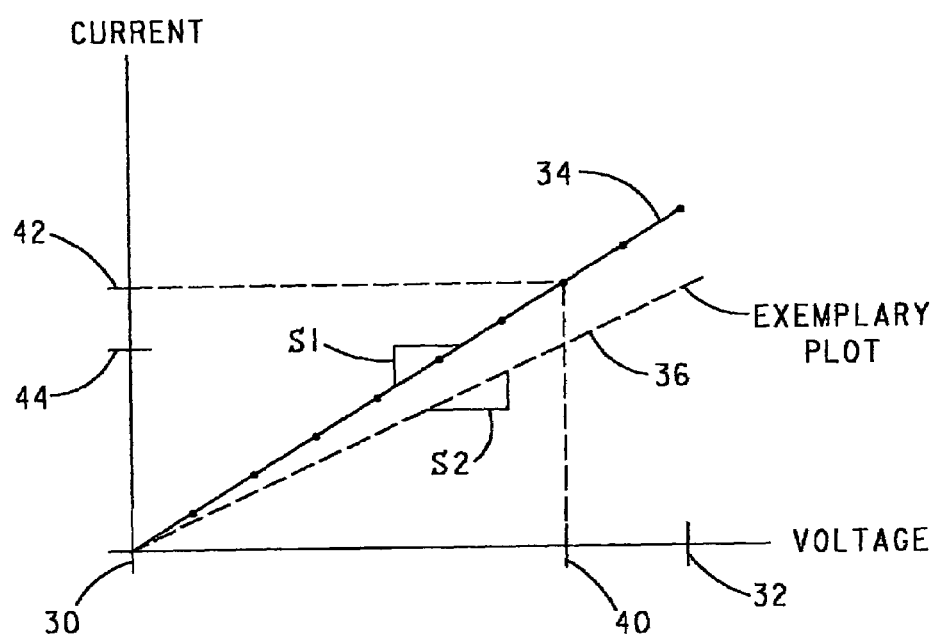
FIG. 5 is a plot of current versus voltage of one of the ion implanted sites of the semiconductor wafer taken by the test system shown in FIG. 3 or FIG. 4.

With reference to FIG. 5, and with continuing reference to FIGS. 1-4, the applied voltage is swept or stepped from a first value 30 toward a second value 32. During the changing of the applied voltage from first value 30 toward second value 32, one or more corresponding values of current are acquired. For purpose of illustration, a plot 34 of a number of acquired values of current for corresponding values of applied voltage is shown in FIG. 5. However, this is not to be construed as limiting the invention since a single value of current can be acquired for a corresponding value of applied voltage.

In the fabrication of semiconductor wafers, repeatability of the ion implantation process in a number of semiconductor wafers is highly desirable. Accordingly, a plot of a number of values of measured current for a corresponding number of values of applied voltage obtained from one or more sites of substrate 4 where ions 16 have been implanted, e.g., plot 34, can be compared to an exemplary plot 36 of measured current versus applied voltage obtained from a known semiconductor wafer, calculated data, empirical data, etc. More specifically, a slope S1 of plot 34 can be compared to a slope S2 of plot 36 to determine if slope S1 is less than, equal to, greater than or within a predetermined range of slope S2. Also or alternatively, for a predetermined value of applied voltage 40, measurement means 26 can determine whether the corresponding value of measured current 42 is less than, equal to, greater than or within a predetermined range of a predetermined value of measured current 44.

For example, if ion implantation is within acceptable tolerance(s), as evidenced by the slope S1 of plot 34 being greater than the slope S2 of plot 36, then measurement means 26 will designate the site of substrate 4 corresponding to plot 34 as being ion implanted within the acceptable tolerance(s). Otherwise, measurement means 26 will designate this site, and perhaps all of semiconductor wafer 2, as not being ion implanted within acceptable tolerance(s). Also or alternatively, measurement means 26 can determine if slope S1 of plot 34 is within a predetermined range, e.g., a predetermined percentage range, of slope S2 of plot 36. This range can be selected based on the degree of process control desired.

Similarly, if ion implantation is within acceptable tolerance(s), as evidenced by the measured value of current 42 for a predetermined applied voltage 40 being greater than a predetermined current value 44 for voltage 40, then measurement means 26 will designate the site associated with measured current value 42 to be ion implanted within acceptable tolerance(s). Also or alternatively, measurement means 26 can determine if measured current value 42 is within a predetermined range of the predetermined current value 44. The extent of this range can be determined by the amount of process control desired.

An advantage of the present invention is that it is unnecessary for semiconductor wafer 2 to be annealed prior to acquiring one or more values of measured current for one or more corresponding values of applied voltage. Since annealing a semiconductor wafer is a time-consuming and, therefore, expensive process, it would be desirable to avoid this annealing step if ion implantation of a semiconductor wafer is not within acceptable tolerance(s). The present invention enables accurate determination of whether ion implantation of a semiconductor wafer is within acceptable tolerance(s) prior to annealing the wafer to activate the ion implantation. Hence, if a semiconductor wafer is not ion implanted within acceptable tolerance(s), the wafer can either be further ion implanted or discarded prior to the time-consuming and costly step of annealing, and any one or more other processing steps between ion implantation and annealing.

While the foregoing embodiment was described in connection with contact 22 or contacts 22 and 22' touching the exposed surface of screen dielectric layer 6, if desired, contact 22 or contacts 22 and 22' can touch the top surface of substrate 4 above or adjacent where ions 16 are implanted if testing whether ion implantation is within acceptable tolerance(s) occurs absent screen dielectric layer 6 on semiconductor wafer 2.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining the efficacy of ion implantation in a semiconductor wafer comprising:
   (a) providing a semiconductor wafer having a substrate of semiconducting material and a screen dielectric layer overlaying the substrate of semiconducting material;
   (b) defining on a surface of the screen dielectric layer opposite the semiconducting material a cured photoresist that includes at least one aperture therethrough where the screen dielectric layer is exposed;
   (c) ion implanting the side of the semiconductor wafer having the photoresist thereon whereupon at least a portion of the ions impacting the screen dielectric layer via the aperture in the photoresist come to rest in the semiconducting material adjacent the aperture;
   (d) removing the photoresist from the semiconductor wafer;
   (e) prior to annealing the semiconductor wafer, forming at least one electrical contact with the surface of either the screen dielectric layer or the substrate of the semiconductor wafer in alignment with or adjacent the semiconducting material containing the ions, wherein each electrical contact is in non-damaging contact with the surface;
   (f) measuring via the electrical contact an electrical response of the semiconducting material containing the ions in response to the application of an electrical stimulus; and
   (g) determining from the measured electrical response whether the ion implantation is within acceptable tolerance(s).

2. The method of claim 1, wherein:
each electrical contact is an electrically conductive probe; and
the portion of each probe that touches the surface elastically deforms within its elastic limits but does not damage the surface.

3. The method of claim 1, wherein the electrical contact is a mercury contact.

4. The method of claim 1, wherein the implanted ions are either p-type ions or n-type ions.

5. The method of claim 1, wherein step (e) includes one of:
forming another electrical contact with the semiconducting material; and
forming a pair of electrical contacts with the surface, with said pair of electrical contacts spaced above or adjacent where the semiconducting material contains the ions.

6. The method of claim 1, wherein step (f) includes:
changing a voltage applied to the electrical contact from a first value toward a second value; and
measuring a current flowing in the electrical contact while the applied voltage changes from the first value toward the second value.

7. The method of claim 6, wherein:
the applied voltage is one of a DC voltage and an AC voltage; and
the measured current is one of a DC current and an AC current, respectively.

8. The method of claim 1, wherein step (g) includes one of:
determining whether a slope of the measured electrical response is one of greater than, less than, equal to, or within a desired range of a slope of an exemplary electrical response; and
for a specific voltage applied to the electrical contact, determining whether a value of a measured current is one of greater than, less than, equal to, or within a desired range of an exemplary current value.

9. A method of determining the efficacy of ion implantation in a semiconductor wafer comprising:
(a) providing a semiconductor wafer having at least one site where ions have been implanted in the semiconducting material of the semiconductor wafer;
(b) prior to annealing the semiconductor wafer of step (a), measuring a current-voltage response of the one site via at least one non-damaging contact with a top surface of the semiconductor wafer; and
(c) determining from the measured current-voltage response whether the ion implantation is within acceptable tolerance(s).

10. The method of claim 9, wherein the measurement of step (b) is taken:
(1) between the semiconducting material of the semiconductor wafer and a top surface of the semiconducting material or a surface of a screen dielectric overlaying the top surface of the semiconducting material; or
(2) between two positions on the top surface of the semiconducting material or a surface of the screen dielectric overlaying the top surface of the semiconducting material.

11. The method of claim 10, further including:
causing a first contact to touch either the top surface of the semiconducting material or the exposed surface of the screen dielectric layer above or adjacent the one site; and
causing a second contact to touch one of the top surface, or a side or a back surface of the semiconducting material, wherein the current-voltage response is measured between the first and second contacts.

12. The method of claim 11, wherein the first contact comprises one of a mercury contact and an electrically conductive probe.

13. The method of claim 11, wherein the second contact comprises one of a conductive surface, a mercury contact and an electrically conductive probe.

14. The method of claim 9, wherein step (c) includes:
determining whether the measured current-voltage response is within a desired range of an exemplary current-voltage response; and
if so, designating the semiconductor wafer as being ion implanted within the acceptable tolerance(s), otherwise, designating the semiconductor wafer as being ion implanted outside the acceptable tolerance(s).

15. The method of claim 9, wherein the ions implanted in the semiconducting material are either p-type ions or n-type ions.

16. A method of determining the efficacy of ion implantation in a semiconductor wafer comprising:
(a) measuring via at least one non-damaging contact with a top surface of a semiconductor wafer a post ion implantation current-voltage response of the semiconducting material of the semiconductor wafer prior to annealing the semiconductor wafer to activate the implanted ions; and
(b) determining from the measured current-voltage response whether the ion implantation is within acceptable tolerance(s).

17. The method of claim 16, wherein the acceptable tolerance(s) is an indication of the number of ions residing in the semiconducting material adjacent the one point.

18. The method of claim 16, wherein step (b) includes at least one of:
determining whether a slope of the measured current-voltage response is less than, equal to, greater than or within a predetermined range of a slope of a predetermined current-voltage response; and
determining for a predetermined applied voltage whether a value of the measured current is less than, equal to, greater than or within a predetermined range of a predetermined current value.

19. The method of claim 16, further including:
causing a first contact to touch the top surface of the semiconductor wafer at the one point; and
causing a second contact to touch one of the top surface of the semiconductor wafer at another point on the top surface of the semiconductor wafer, a side of the semiconductor wafer or the bottom surface of the semiconductor wafer, wherein step (a) includes:
applying a swept or stepped voltage between the first and second contacts; and
measuring the response of the semiconductor wafer to the swept or stepped voltage.

20. The method of claim 19, wherein:
the first contact comprises one of a mercury contact and an electrically conductive probe; and
the second contact comprises one of a conductive surface, a mercury contact and an electrically conductive probe.

21. The method of claim 20, wherein the implanted ions are either p-type ions or n-type ions.

* * * * *